United States Patent [19]

Young et al.

[11] 4,418,095

[45] Nov. 29, 1983

[54] METHOD OF MAKING PLANARIZED JOSEPHSON JUNCTION DEVICES

[75] Inventors: Peter L. Young, North Wales; Barry F. Stein, Dresher; John E. Sheppard, Cornwells Heights, all of Pa.

[73] Assignee: Sperry Corporation, New York, N.Y.

[21] Appl. No.: 362,578

[22] Filed: Mar. 26, 1982

[51] Int. Cl.³ ............................................. H01L 39/24
[52] U.S. Cl. ....................................... 427/63; 427/99; 427/250; 427/255.4; 427/255.5; 427/255.7; 427/404; 427/419.2; 156/656; 156/659.1
[58] Field of Search ................ 427/63, 99, 250, 255.4, 427/255.5, 255.7, 404, 419.2; 156/656, 659.1; 204/192 C, 192 D, 192 EC

[56] References Cited

U.S. PATENT DOCUMENTS

| | | | |
|---|---|---|---|
| 3,985,597 | 10/1976 | Zielinski | 430/319 |
| 4,123,565 | 10/1978 | Sumitomo et al. | 156/656 |
| 4,129,167 | 12/1978 | Sigsbee | 427/62 |
| 4,224,361 | 9/1980 | Romankiw | 427/99 |
| 4,256,816 | 3/1981 | Dunkleberger | 427/63 |
| 4,339,305 | 7/1982 | Jones | 204/192 C |
| 4,353,935 | 10/1982 | Symersky | 427/89 |

OTHER PUBLICATIONS

Greiner et al., Fabrication Process for Josephson Integrated Circuits, IBM J. Res. Develop., vol. 24, No. 2, Nov. 1980.

*Primary Examiner*—Norman Morgenstern
*Assistant Examiner*—Richard Bueker
*Attorney, Agent, or Firm*—John B. Sowell; Thomas J. Scott; Marshall M. Truex

[57] ABSTRACT

The present invention teaches a method of planarizing built-up vacuum deposited surfaces or areas on Josephson junction and semiconductor devices so that successively deposited layers do not replicate the undulations of previous layers. After a surface layer is deposited in a vacuum system and part of the surface is etched, a raised surface is generated. A photoresist lift-off stencil is applied to the surface to be preserved and the material to be removed is removed by isotropically etching so as to leave an overhang or ledge of photoresist material over the area of the material retained. A new layer of material is now deposited by vacuum deposition so as to almost fill the area to be planarized. A small gap remains between the top of the new material being vacuum deposited and the botton of the photoresist stencil so that solvent can be introduced to the stencil. When the photoresist stencil is removed, the top of surface being preserved is substantially planar with the new layer of material.

11 Claims, 11 Drawing Figures

METHOD OF MAKING PLANARIZED JOSEPHSON JUNCTION DEVICES

BACKGROUND OF THE INVENTION

1. Field of the Invention

This invention relates to a new method of making super-conducting Josephson junctions. More particularly, this invention relates to a method of planarizing Josephson junction devices which substantially improves the yield as well as the circuit density. More generally, this invention relates to a method of planarizing any metal conductor line in an integrated circuit. 2. Description of the Prior Art Numerous published articles have described the problems that arise as a result of attempting to fabricate Josephson tunnel junction devices. Some of these problems relate to thermal cycling and others relate to the actual process of building up the layers which comprise a Josephson tunnel junction device. When layers of a Josephson tunnel junction device are built up, they are usually made by the process of vacuum deposition. It is well known that the process of vacuum deposition forms a substantially uniform layer over the area being coated. It is also well known that Josephson junction devices comprise a base electrode and a counter electrode with a Josephson tunnel junction therebetween. In the preferred embodiment of making Josephson junction devices, the base electrode is first made on a substrate as a raised discrete area. Preferably this base electrode is a very small area to achieve high packing density on the substrate. As vacuum deposited layers are built up on top of this base electrode, they replicate the contour and generate what is called a step. Heretofore, layers built up over the base electrode have been made much thicker than is desirable for optimizing the electrical properties in order to achieve a smoothing effect. However, this smoothing effect is not to be confused with planarization.

Prior art process steps employed in the manufacture of semiconductor devices are to some extent capable of accomplishing smoothing effects or planarization. For example, when applying a photoresist to an irregular surface, it is possible to use a thicker photoresist which will achieve some smoothing effect. By applying subsequent layers of such photoresist, the smoothing effect can finally achieve a surface which is substantially planarized. As a further example, it has been possible to coat a single layer of thick photoresist two micrometers thick over a surface having irregular raised surfaces two tenths of one micrometer in height. The photoresist was cured in a known way and the result achieved was a surface planarized within 200 Å. Another material which has been used, when applicable, to planarize a layer is a liquid solution containing polyamic acid which is cured to form a polyimide layer. The use of photoresist, polyamic and other organic base liquids to form insulation layers is not applicable to Josephson junction devices because of the extreme temperatures encountered in operation. None of the aforementioned known examples of planarization are related to planarizing when forming layers by vacuum deposition. The only known examples of prior art planarization are achieved through having a material which will flow in a semi-liquid state.

It would be highly desirable to provide a method of planarization which could be carried out while vacuum depositing layers of a Josephson junction device. If such planarization could be achieved, it would be expected that the yields and circuit density of the Josephson junction integrated circuit could be substantially improved. Planarization of the layer permits better line width control because surface irregularities degrade line width. Electrical properties are more controllable when uniformly thick layers can be obtained.

SUMMARY OF THE INVENTION

It is a principal object of the present invention to provide a new method of planarizing the base or counter electrode of a Josephson junction device.

It is another principal object of the present invention to provide a method of making Josephson junction devices which have thinner layers and are more immune to thermal cycling than Josephson junctions made heretofore.

It is yet another principal object of the present invention to provide a method of making base electrodes for Josephson junction devices which permit higher circuit densities and higher yields than those achieved heretofore.

It is yet another object of the present invention to provide a method of planarization which yields better photolithographic resolution and line width control at the tunnel junction, and better line width control results in more consistently uniform junction critical current within a wafer and from wafer to wafer.

It is yet another general object of the present invention to provide a novel method of producing planar layers which are substantially uniform in thickness and permit better control of electrical parameters such as capacitance, inductance and strip line impedance.

According to these and other objects of the present invention, there is provided a silicon substrate wafer which is placed in a vacuum bell jar system for the deposition of the base electrode on the substrate. After the discrete base electrode is built up on the substrate, a layer of silicon oxide the same thickness as the base electrode is built up on either side of the base electrode so that the top of the silicon oxide insulation layer and the top of the base electrode are substantially planarized. A second SiO layer is evaporated to define the tunnel junction area. A tunnel barrier junction is formed and a counter electrode is evaporatively deposited on top of the tunnel barrier junction to form a planarized Josephson junction device.

DESCRIPTION OF THE PREFERRED EMBODIMENT

Before describing the problems solved by the present invention, it is preferred to use the following definitions;

For purposes of this invention, a planar surface is refered to as a surface which has undulations of approximately 400 Å or less.

For purposes of this invention line width control shall mean the ability to photolithographically reproduce the designed device line widths on the surface of the photoresist. Surface irregularities invariably degrade the ability to control line width. Accurate line width permits the area of the barrier tunnel junction to be repeated within closer tolerances. It is well known that the junction critical current is a function of the area of the barrier tunnel junction and the tunnel barrier thickness. Accordingly, better line width control results in more consistent and more uniform junction critical current in the barrier tunnel junction of a wafer and from water to wafer.

For purposes of this invention, a step refers to the edge of a layer of a semiconductor or superconductive device and shall mean the vertical distance or height of the layer between the upper and lower surfaces of either an insulating layer or a metal layer.

It will be understood that the present invention is applicable to both semiconductor devices and superconducting devices especially where vacuum deposition techniques are employed. The process of planarization is illustrated in the present invention with reference to Josephson junction superconducting devices because the problems associated with non-planar surfaces are more acute and critical.

In such devices, the lack of line width control reduces the circuit density and further reduces the ability to replicate electrical properties.

In such devices, where a sharp step occurs, the insulating layer over the sharp step may crack and cause shorting between the base and counter electrodes.

In such devices, the counter electrode is built up over the base electrode and the insulating layer and where sharp steps occur, the counter electrode itself may crack leading to discontinuity in the counter electrode resulting in device failure.

In semiconductor devices, sharp steps at any larger generate stress points which are subject to crack failures but also induce and enhance electromigration in the metal layers. Electromigration in the conducting lines will cause premature failure.

In such devices, it is often necessary to increase the thickness of the deposited layers to smooth the extreme steps present in layers below. It is well known that thin film layers are capable of tolerating greater stresses than thick film layers.

Figure 1:
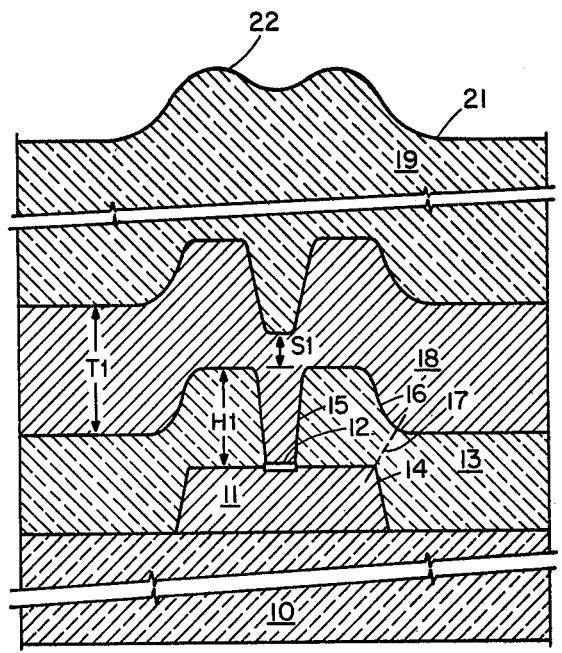
FIG. 1 is an enlarged schematic cross-sectional view of a typical prior art Josephson junction device.

Refer now to FIG. 1 of the drawings which shows an enlarged cross-section in elevation of a typical prior art Josephson junction. Wafer 10 is the substrate upon which the layers will be applied. Preferably for Josephson junction applications, the wafer 10 comprises a high purity flat silicon wafer having a thermally grown silicon oxide non-porous layer applied to the top surface. Such wafers 10 are well known in the prior art. Typically, such wafers are ten mils in thickness and two to five inches in diameter. The base electrode 11 is typically made from a lead alloy or niobium and formed by vacuum deposition. Such layers are preferably around 2000 Å thick. On top of the base electrode a small area is isolated and the barrier tunnel junction 12 is formed thereon preferably by radio frequency oxidation. Such barrier tunnel junction layers are partially formed into the base electrode layer and partially above the base electrode layer to a thickness of around 40 Å. A silicon oxide layer 13 is formed over the step 14 of the base electrode 11 and covers the top of the base electrode except for the barrier tunnel junction 12. Typically, the thickness of the silicon oxide layer 13 is approximately 300 Å thick. The wall or step 15 is substantially linear and steep in shape whereas the wall 16 forms in a smooth contour shape above the step 14. However, the distance between the top of the step and the radius of the smooth contour 16 as shown at line 17 is substantially less than 3000 Å thick and creates an area in which stress concentrations can cause failures. After the silicon oxide layer 13 is deposited over the desired areas of the substrate 10 and the base electrode 11 a counter electrode 18 is deposited over the entire surface shown in FIG. 1. However, it will be understood that the counter electrode 18 may have a predetermined pattern in which it is only necessary to make connection to the barrier tunnel junction 12. Preferably, the counter electrode 18 is approximately 4000 Å thick and is made from a superconducting material such as lead alloys or niobium. After the counter electrode 18 is made, the active Josephson junction device is represented by the tunnel barrier junction 12 sandwiched between base electrode and the counter electrode. Leads (not shown) attached to the base electrode 11 and counter electrode 18 provide means for connecting the Josephson junction device to a circuit. To protect the Josephson junction device, a passivation layer 19 is applied over the counter electrode 18. Preferably, the passivation layer 19 is made from silicon oxide and in the prior art is made approximately two micrometers thick (20,000 Å). In the prior art Josephson junction device, it will be noted that the thickness of the counter electrode 18 shown as T1 must be made larger than the height H1 to achieve the separation S1 at the critical step 15 above the tunnel barrier juntion 12. As will be explained hereinafter, the thickness of the counter electrode 18 is made thicker than would be desirable which causes the layer to be more susceptible to thermal cycling and also tends to increase grain size of the counter electrode material which causes the layer to also be more susceptible to failure at the barrier junction 12 due to thermal cycling. As will be explained hereinafter, the passivation layer 19 is also made thicker than is optimumly desired in order to make the top surface 21 smooth over the step 15 as shown at contour 22.

Figure 2:
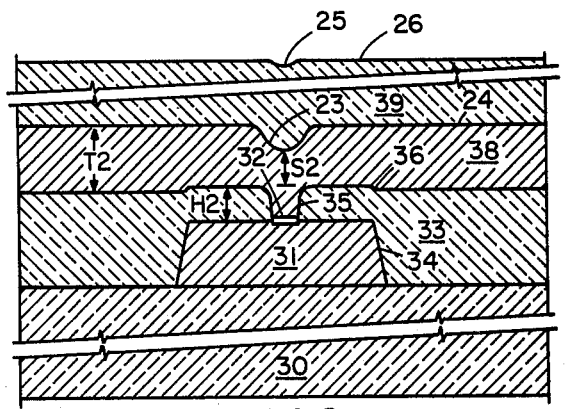
FIG. 2 is an enlarged schematic cross-sectional view of a preferred embodiment planarized Josephson junction device.

Refer now to FIG. 2 showing in enlarged cross-section a preferred embodiment Josephson junction employing the present invention planarizing surface technique. The wafer 30 is the same as the wafer 10 and the base electrode 31 is the same as the base electrode 11. Also the barrier tunnel junction 32 is formed as previously described with reference to barrier tunnel junction 12 of FIG. 1. The silicon oxide insulation layer 33 is formed in such a manner that the total thickness is only approximately 2600 Å thick even though it is formed over the same step 34 as the step 14. The insulation tunnel junction step 35 is now substantially reduced in height and the insulation base electrode step 16 shown at point 36 has been virtually eliminated. Thus, there is no stress line concentration over the step as occurred in the prior art shown at line 17. When the counter electrode layer is formed over the insulation layer after forming the barrier tunnel junction 32, it may be made only approximately 2000 Å thick which is the optimum and most preferred thickness for this electrode 38. Even though the top surface 24 of the base electrode has a contour 23 which is smooth, it still maintains the same or even greater separation S2 as before even through the thickness T2 and the height H2 have been substantially reduced. Further, the passivation layer 39 may now be made only approximately 5000 Å thick which is most desirable for both electrical properties and reducing stress concentrations. The contour 25 in the top surface 26 of passivation layer 39 is virtually eliminated but is shown exaggerated to illustrate that such contour may occur. As will be discussed in greater detail hereinafter, the thickness of the layers of the Josephson junction device have been optimized to their most desirable thickness while virtually eliminating stress concentration points which cause said cracking and electrical failure.

Figure 3:
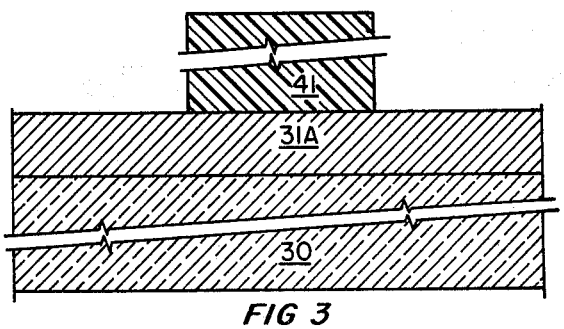
FIG. 3 is an enlarged schematic cross-sectional view of a substrate wafer having a layer of base electrode material thereon and a typical photoresist pattern on top which defines the base electrode.

Refer now to FIG. 3 showing the first of the series of steps in making the preferred embodiment Josephson junction shown in FIG. 2. The wafer or substrate 30 is shown having applied thereon a complete and uniform layer the base electrode material 31. On top of the base electrode material 31 there is shown a photoresist pattern 41 in rectangular shape. It will be understood that the photoresist pattern is made by applying a complete layer and treating the photoresist in such a manner that only the pattern 41 remains. No special new technique is employed at this point to achieve the shape of the photoresist profile.

Figure 4:
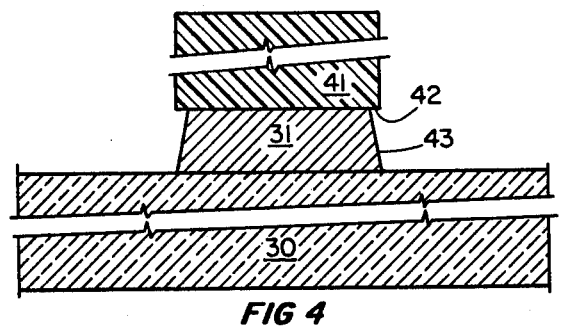
FIG. 4 is an enlarged schematic cross-sectional view of the photoresist pattern of FIG. 3 after etching away substantial portions of the base electrode material not covered by the photoresist pattern.
Figure 5:
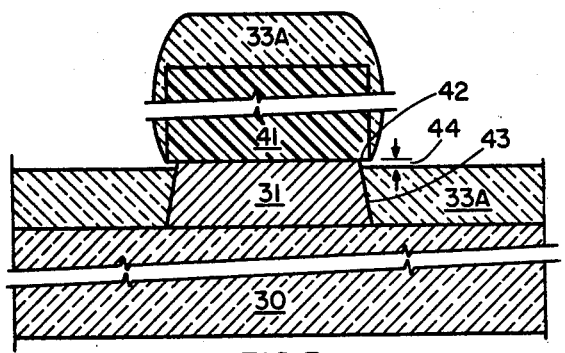
FIG. 5 is an enlarged schematic cross-sectional view of the photoresist pattern covered base electrode of FIG. 4 after deposition of a silicon oxide insulation layer.

Refer now to FIG. 4 showing the same photoresist pattern 41 after the base electrode material 31 has been isotropically etched to provide an undercut ledge 42 under the photoresist 41. The tapered shape 43 of the side of the base electrode material 31 is shown linear for schematic purposes even though it is well known that isotropic etching causes a rounded contour. Since the thicknesses of the layers being described are so thin compared to the width of the base electrode 31 and the pattern of photoresist 41, it is impossible to show this in proper perspective. Only after the base electrode 31 is shaped to form the undercut ledge 42 can the silicon oxide layer 33A be applied by vacuum deposition. The vacuum deposited silicon oxide layer 33A is shown in FIG. 5 covering the exposed wafer surface 30 and filling in the sides of the base electrode 31 shown at the undercut profile 43. Instead of making the silicon oxide layer 33A the same height as the base electrode 31, the layer is made thinner by approximately 400 Å leaving a horizontal gap 44 which exposes the ledge 42 of photoresist 41. It will be noted that the thickness of silicon oxide layer 33A has formed on top of the photoresist pattern 41 and has also formed along the sides of the photoresist pattern 41 but has not formed in the gap area 44 thus producing a discontinuity of the silicon oxide material completely around the photoresist pattern 41. In the preferred embodiment method to be described in more detail hereinafter, the thickness of the gap 44 need only be as thick as is necessary to assure that the gap 44 is completely around the photoresist 41 to ensure that solvent material can enter into the gap and reach the ledge 42 and dissolve the photoresist pattern 41. This step, in which the pattern 41 and the silicon oxide on top of the pattern 41 is removed, is known as the lift-off technique.

Figure 6:
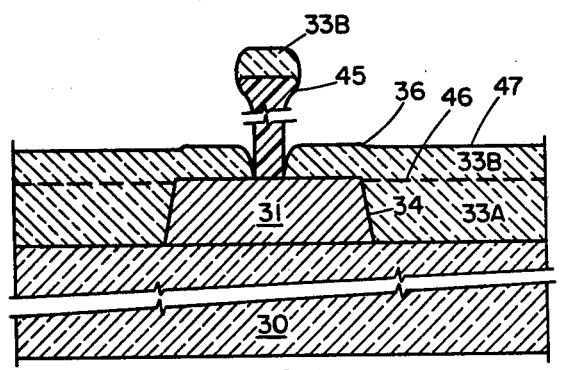
FIG. 6 is an enlarged schematic cross-sectional view of the base electrode of FIG. 5 after removing the photoresist lift-off pattern and applying a second mushroom photoresist pattern over the tunnel barrier junction area and after deposition of a second silicon oxide insulation layer thereon.

Refer now to FIG. 6 showing the structure of FIG. 5 after the pattern 41 and the silicon oxide layer 33A thereon has been removed by the lift-off technique. After removing the photoresist 41, a new or second photoresist mushroom shaped pattern 45 is applied to define the barrier junction area. Mushroom shaped photoresist patterns are well known and in the preferred embodiment shown here is from 5000 Å to 10,000 Å thick. This thickness is less than is required in the prior art as will be explained hereinafter. After forming the mushroom shape photoresist pattern 45, it is now possible to evaporate and deposit the second silicon oxide layer 33B. The thickness of the layer 33B is shown as dotted line 46, however, the two layers 33A and 33B form as a continuous layer 2600 Å thick. The second silicon oxide layer 33B is preferably only 1000 Å thick and forms on top of the mushroom shape photoresist pattern 45 leaving the sides of the pattern exposed. The contour 36 over the step 34 is shown exaggerated in this view. In the preferred embodiment Josephson junction device using a gap 44 of 400 Å, this contour is smooth and less than 200 Å in height. Smoothing of the contour 36 and virtually eliminating the step at this point results in a virtual planar surface 47 at the top of the silicon oxide layer 33, except at the junction 32.

Figure 7:
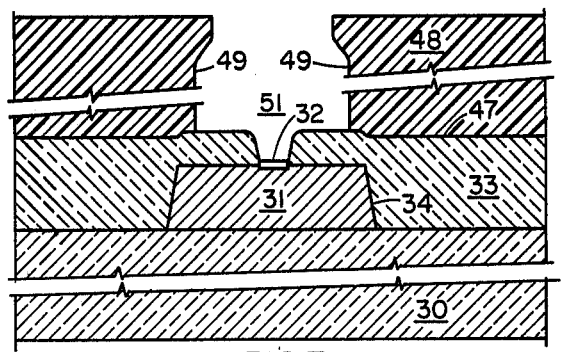
FIG. 7 is an enlarged schematic cross-sectional view of the silicon oxide partially covered base electrode of FIG. 6 after the deposition of a third photoresist pattern and after the formation of the tunnel barrier junction.

FIG. 7 shows the partially completed Josephson junction device after the mushroom shape photoresist pattern 45 and a silicon oxide layer 33B thereon has been removed and a third photoresist pattern 48 has been applied on top of the surface 47 of the silicon oxide insulation layer 33. The inner edges 49 of the photoresist pattern 48 are made by the same techniques applied to the mushroom pattern 45 providing a suitable lift-off profile. The two edges 49 now define the limits of an aperture 51 which establish the width and line parameters for the counter electrode which will be deposited at a later step. Before depositing the counter electrode, oxygen is introduced into the system and by radio frequency oxidation the barrier tunnel junction 32 is formed on top of the base electrode 31. As previously mentioned, the barrier tunnel junction forms partially into the base electrode material and partially above the base electrode 31. Without having to move the partially complete Josephson junction device from the vacuum chamber system, it is now possible to continue with vacuum deposition steps and to evaporate and deposit the counter electrode.

Figure 8:
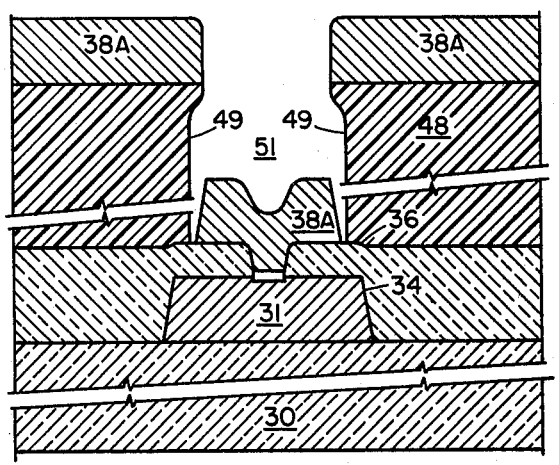
FIG. 8 is an enlarged schematic cross-sectional view of the FIG. 7 structure after deposition of the counter electrode material.

Refer now to FIG. 8 showing the same structure of FIG. 7 after the counter electrode 38A has been deposited by vacuum deposition techniques. The contour of the photoresist pattern 48 is narrower at the top than at the aperture sides 49 which permits the counter electrode to form without touching the edges 49 of the photoresist pattern 48. The counter electrode 38A may be formed as a series of layers of different metals and then annealed to form a homogeneous alloy or may be deposited as an alloy or a pure material. For example, a preferred method of forming the base electrode 31 and counter electrode 38A is to apply layers of lead, gold, indium and bismuth in a desired combination. After applying the desired layers in a desired thickness these base electrodes 31 and counter electrodes 38 may be annealed to form a homogeneous electrode material as is well known in this art. After the counter electrode 38A is formed, the photoresist pattern 48 and counter electrode material 38A thereon may be removed by the lift-off technique.

Figure 9:
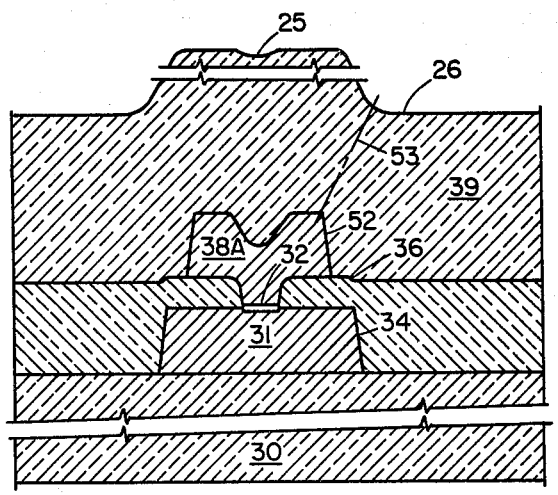
FIG. 9 is an enlarged schematic cross-sectional view of the Josephson junction device structure of FIG. 8 after removal of the third photoresist pattern and the deposition of an insulating passivation layer.

FIG. 9 shows the partially complete Josephson junction device shown in FIG. 8 after the photoresist pattern 48 has been removed and after a passivation layer 39 has been deposited thereon. In the preferred embodiment Josephson junction device which was planarized, the passivation layer 39 was made 5000 Å thick and not 20,000 Å thick as was required for prior art devices. The preferred embodiment Josephson junction device shows an exaggerated step 34 on the base electrode 31. The counter electrode 38A has been made the same thickness as the base electrode 31 and also involves a steep step 52 as a result of vacuum deposition. Since the step 52 is not as high as the prior art step 15, the passivation layer 39 need not be made as thick as was made in the prior art to assure that the top surface 26 has a substantial smoothing effect over the counter electrode 38A and reduces the stress concentration which occurs along the counter electrode stress line 53. Further, the contour 25 which is opposite the barrier tunnel junction 32 is substantially reduced if not smooth. The Josephson junction devices shown in FIGS. 2 and 9 are shown differently to illustrate the most extreme step 52 in FIG. 9. Even with the extreme step 52 at the side of the counter electrode 38A, it is possible to reduce the thickness of the passivation layer 39 to reduce stresses and avoid cracking which would expose the electrode to potentially corrosive atmospheres.

Figure 10:
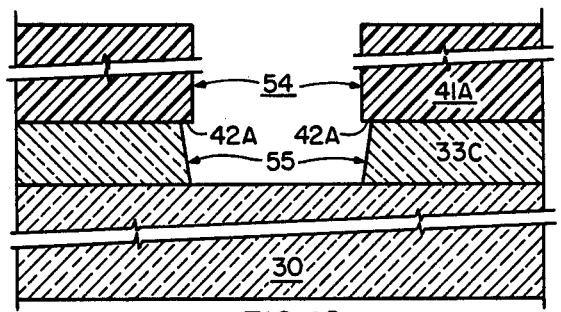
FIG. 10 is an enlarged schematic cross-sectional view of another photoresist pattern applied on top of a silicon oxide layer to permit the etching of a base electrode aperture in the silicon oxide.
Figure 11:
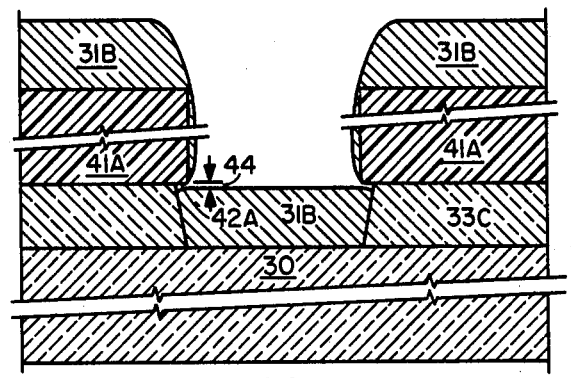
FIG. 11 is an enlarged schematic cross-sectional view of the structure of FIG. 10 after the deposition of the base electrode material in the base electrode aperture and on the photoresist pattern.

Refer now to FIGS. 10 and 11 which will be employed to explain a modification of the preferred embodiment method steps explained hereinbefore with reference to FIGS. 2 through 9. The photoresist pattern 41 shown in FIG. 3, which was applied to the continuous layer of base electrode material 31, may be modified in order to form a substantially identical base electrode 31 by the technique described below. A photoresist pattern 41A may be applied on top of a silicon oxide layer 33C so as to provide an aperture 54 which exposes a portion of the silicon oxide layer 33. In FIG. 10, plasma etching through the aperture 54 in the photoresist pattern 41A permits the formation of a base electrode aperture 55 in the silicon oxide 33C. After the base electrode aperature 55 is formed so as to provide undercut ledges 42A, the photoresist pattern 41A is left in place and the base electrode 31B is formed therein by vacuum deposition of the afore-mentioned base electrode materials. The deposition of the base electrode 31B also causes deposits of the base electrode material to form on top of the photoresist and marginally on the sides of photoresist pattern 41A. As long as the gap 44 is provided above the top of the base electrode 31B, it is possible for solvent to be introduced under the photoresist pattern 41A at ledge 42A. After the formation of the base electrode 31B by the modified technique described above, the same steps which are required after FIG. 5 of the preferred embodiment are performed to produce a substantially equivalent Josephson junction device. This is to say that the photoresist pattern 41A and material 31B thereon is stripped away leaving the planarized surface comprising the tops of the base electrode and the adjacently deposited silicon oxide layers.

In the preferred embodiment and the modified embodiment described hereinbefore, the substrate 30 was placed opposite a series of boats containing the material to be evaporatively deposited on the substrate 30. The substrate was offset between five and fifteen degrees and mounted on a rotary platform so as to assure that the materials being evaporatively deposited along a line of sight formed under the ledges 42 and 42A of the photoresist patterns 41 and 41A filled in completely to the sides 43 to provide a substantially flat top to the base electrodes 31 and 31B.

It is also possible to ensure scattering of the materials being deposited under the ledges 42 and 42A by adding inert gas, such as argon, to the vacuum chamber in a pressure range of between one and one hundred micrometers.

Having explained a preferred embodiment method of planarizing the base electrode of a Josephson junction device in which the stress conditions are most severe, it will be understood that the same method steps may be applied to the modified Josephson junction device shown and described with reference to FIGS. 10 and 11. Further, it should be understood that the novel step of planarizing while performing vacuum deposition steps in a vacuum chamber system may also be applied to the counter electrode and other layers of the Josephson junction device. Any hard or non-organic metal or insulation layer of a semiconductor device may be planarized. Since integrated circuits are becoming much smaller and being made with higher density patterns, the present planarizing technique may be employed to improve the yields of the individual devices made on a wafer and also to improve the consistency and uniformity of the current characteristics of devices made on different wafers.

We claim:

1. A method of making planarized Josephson junction devices having raised base electrodes, comprising the steps of:

providing a substantially non-porous dielectric substrate, evaporating and depositing a uniform layer of base electrode material on said substrate in a vacuum chamber, applying a photoresist pattern on said base electrode layer which defines a base electrode area, etching away portions of said base electrode material leaving a discrete tapered raised base electrode having a ledge undercut below the photoresist pattern area, placing said substrate in a vacuum chamber disposed at a predetermined offset angle from a source of planarizing insulation material, rotating said offset substrate, evaporating and depositing a planarizing insulation layer to form a uniform layer on said substrate which connects to the sides of said tapered raised base electrode under said ledge of said photoresist pattern leaving a horizontal gap between the top of said planarizing insulation layer on said substrate and the bottom of said photoresist pattern, dissolving said planarizing insulation layer coated photoresist pattern by introducing liquid solvent through said gap under said ledge of said photoresist pattern, removing the remaining photoresist pattern and said planarizing insulation layer thereon leaving the top of said tapered raised base electrode exposed and planarized within said uniform planarizing insulation layer having undulations of approximately 400 angstroms or less, applying a second photoresist pattern to provide a mushroom shaped isolated photoresist area on a portion of said base electrode where a tunnel barrier junction will be formed, evaporating and depositing a via insulation layer over the planarized layers, part of said base electrode, and said second photoresist pattern, dissolving said mushroom shaped photoresist pattern, removing the remaining photoresist pattern and the via insulation layer coated thereon leaving a via aperture at said tunnel barrier junction area in said via insulation layer, applying a third photoresist pattern over said via insulation layer defining an open counter electrode area, oxidizing the exposed base electrode material in the bottom of said via aperture to form a tunnel barrier junction, evaporating and depositing counter electrode material in said open counter electrode area of said third photoresist pattern, and removing said third photoresist pattern leaving a planarized Josephson junction device comprising two electrodes and a tunnel barrier junction therebetween.

2. A method of making planarized Josephson junction devices as set forth in claim 1 wherein the step of placing said wafer in the vacuum chamber disposed at a predetermined offset angle in the range of from five to fifteen degrees.

3. A method of making planarized Josephson junction devices as set forth in claim 2 wherein said predetermined offset angle is never so great as to cause planarizing insulation layer to close said gap.

4. A method of making planarized Josephson junction devices as set forth in claim 1 wherein said gap between the top of said planarizing insulation layer and the bottom of said photoresist pattern forming said ledge is between 200 Å and 400 Å.

5. A method of making planarized Josephson junction devices as set forth in claim 1 wherein the step of etching away portions of said base electrode material is performed by liquid chemical etching to form said undercut.

6. A method of making planarized Josephson junction devices as set forth in claim 1 wherein said step of etching away portions of said base electrode material is performed by plasma etching to form said undercut.

7. A method of making planarized Josephson junction devices as set forth in claim 6 wherein said plasma etching is performed to yield wall angles between thirty and seventy degrees employing a modified isotropic etching technique.

8. A method of making planarized Josephson junction devices having raised base electrodes, comprising the steps of:

providing a substantially non-porous dielectric substrate, evaporating and depositing a uniform layer of insulation material on said substrate in a vacuum chamber, applying a photoresist pattern on said base electrode layer which defines a base electrode area, etching away portions of said insulating material leaving a discrete tapered base electrode aperture having a ledge undercut below the photoresist pattern area, placing said substrate in a vacuum chamber disposed at a predetermined offset angle from a source of base electrode material, rotating said offset substrate, evaporating and depositing a base electrode material to form a uniform layer on said substrate which connects to the sides of said tapered insulation material in said aperture under said ledge of said photoresist pattern leaving a horizontal gap between the top of said base electrode material on said substrate and the bottom of said photoresist pattern, dissolving said base electrode material coated photoresist pattern by introducing liquid solvent through said gap under said ledge of said photoresist pattern, removing the remaining photoresist pattern and said base electrode material thereon leaving the top of said tapered raised base electrode exposed and planarized within said uniform insulating material layer having undulations of approximately 400 angstroms or less, applying a second photoresist pattern to provide a mushroom shaped isolated photoresist area on a portion of said base electrode where a tunnel barrier junction will be formed, evaporating and depositing a second via insulation layer over the planarized layers and said second photoresist pattern, dissolving said mushroom shaped photoresist pattern, removing the remaining photoresist pattern and the via insulation layer coated thereon leaving a via aperture at said tunnel barrier junction area in said via insulation layer, applying a third photoresist pattern over said via insulation layer defining an open counter electrode area, oxidizing the exposed base electrode material in the bottom of said via aperture to form a tunnel barrier junction, evaporating and depositing counter electrode material in said open counter electrode area of said third photoresist pattern, and removing said third photoresist pattern leaving a planarized Josephson junction device comprising two electrodes and a tunnel barrier junction therebetween.

9. A method of making a planarized layer on an undulated layer employing vacuum deposition of material in a vacuum chamber, comprising the steps of:

providing a partially processed wafer having a substantially uniform surface layer to be processed, applying a photoresist pattern over the areas of said uniform surface layer to be retained, isotropically etching and removing the areas of said uniform surface layer not covered by said photoresist pattern thus leaving raised portions of said uniform surface layer being processed under said photoresist pattern and leaving bare spaces adjacent thereto, said step of isotropically etching said uniform surface layer further leaving undercut ledges at the bottom surface of said photoresist pattern adjacent said raised portions of said uniform surface layer, evaporating and depositing a substantially uniform thickness planarizing layer material on top of said photoresist pattern and on top of said bare spaces to build up said planarizing layer at said bare spaces to a thickness only slightly less than the thickness of said uniform surface layer under said photoresist pattern, leaving a gap between the top of said planarizing layer material and the bottom of said photoresist pattern at said undercut ledge, dissolving said photoresist pattern on said areas of said uniform surface layer to be retained by introducing a solvent in said gap, and removing said photoresist pattern and said planarizing layer material on top of said photoresist pattern thus leaving a substantially uniform planarized surface having undulations of approximately 400 angstroms or less defined by the top of said raised portion of said uniform surface layer being retained and the top of said planarizing layer.

10. A method of making planarized Josephson junction devices having raised base electrodes, comprising the steps of:

providing a substantially non-porous dielectric substrate, evaporating and depositing a uniform layer of base electrode material on said substrate in a vacuum chamber, applying a photoresist pattern on said base electrode layer which defines a base electrode area, etching away portions of said base electrode material leaving a discrete tapered raised base electrode having a ledge undercut below the photoresist pattern area, placing said substrate in a vacuum chamber disposed from a source of planarizing insulation material, increasing the pressure in said vacuum chamber by introducing an inert gas into said vacuum chamber, evaporating and depositing a planarizing insulation material which collides during deposition with the inert gas to scatter and form a uniform layer on said substrate which connects to the sides of said tapered raised base electrode under said ledge of said photoresist pattern leaving a horizontal gap between the top of said planarizing insulation layer on said substrate and the bottom of said photoresist pattern, dissolving said planarizing insulation layer coated photoresist pattern by introducing liquid solvent through said gap under said ledge of said photoresist pattern, removing the remaining photoresist pattern and said planarizing insulation layer thereon leaving the top of said tapered raised base electrode exposed and planarized within said uniform planarizing insulation layer having undulations of approximately 400 angstroms or less, applying a second photoresist pattern to provide a mushroom shaped isolated photoresist area on a portion of said base electrode where a tunnel barrier junction will be formed, evaporating and depositing a via insulation layer over the planarized layers and said second photoresist pattern, dissolving said mushroom shaped photoresist pattern, removing the remaining photoresist pattern and the via insulation layer coated thereon leaving a via aperture at said tunnel barrier junction area in said via insulation layer, applying a third photoresist pattern over said via insulation layer defining an open counter electrode area, oxidizing the exposed base electrode material in the bottom of said via aperture to form a tunnel barrier junction, evaporating and depositing counter electrode material in said open counter electrode area of said third photoresist pattern, and removing said third photoresist pattern leaving a planarized Josephson junction device comprising two electrodes and a tunnel barrier junction therebetween.

11. A method of making planarized Josephson junction devices as set forth in claim 10 wherein said inert gas consists substantially of argon at a pressure between one and one hundred micrometers to ensure scattering of said planarizing insulation layer material being deposited under said ledge.

* * * * *